United States Patent
Lee et al.

(10) Patent No.: US 6,383,882 B1
(45) Date of Patent: May 7, 2002

(54) METHOD FOR FABRICATING MOS TRANSISTOR USING SELECTIVE SILICIDE PROCESS

(75) Inventors: Sun-wung Lee; Jae-phil Boo, both of Suwon; Kyung-hyun Kim, Seoul; Chang-ki Hong, Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/860,591

(22) Filed: May 21, 2001

(30) Foreign Application Priority Data

Aug. 21, 2000 (KR) .............................. 00-48326

(51) Int. Cl.[7] .......................................... H01L 21/336
(52) U.S. Cl. ...................................... 438/303; 438/649
(58) Field of Search ................................ 438/299–304, 438/649, 651, 655, 682

(56) References Cited

U.S. PATENT DOCUMENTS 6,096,662 A * 8/2000 Ngo et al. .................. 438/798
6,255,180 B1 * 7/2001 Smith .......................... 438/301

* cited by examiner

*Primary Examiner*—Jey Tsai
(74) *Attorney, Agent, or Firm*—The Law Offices of Eugene M. Lee, PLLC

(57) ABSTRACT

A method for fabricating a MOS transistor using a selective silicide process wherein a gate insulating layer and a gate polysilicon layer are sequentially formed on a silicon substrate, and a gate spacer is formed on a side wall of the gate insulating layer and the gate polysilicon layer. Impurity ions are implanted and diffused using the gate spacer and the gate polysilicon layer as a mask layer to form a source/drain region in the substrate. An etching blocking layer is formed to cover the source/drain region, the gate spacer, and the gate polysilicon layer, and then, a dielectric layer to cover the etching blocking layer is formed. The dielectric layer is planarized, and the etching blocking layer on the gate polysilicon layer is exposed. The exposed etching blocking layer and a part of the gate spacer are etched, and a top surface and a top side of the gate polysilicon layer are exposed. A silicide layer is formed over the exposed part of the gate polysilicon layer.

15 Claims, 5 Drawing Sheets

METHOD FOR FABRICATING MOS TRANSISTOR USING SELECTIVE SILICIDE PROCESS

BACKGROUND OF THE INVENTION

1. Field of the Invention

The present invention relates to a method for fabricating a semiconductor device and, more particularly, to a method for fabricating a MOS transistor using a selective silicide process.

2. Description of the Related Art

Currently, a silicide process is almost essential to fabricate a transistor used for a logic device. In the silicide process, a metal having a high melting point or a transition metal is stacked over a silicon or a polysilicon layer, and heat-treated to form a silicide, an alloy of metal and silicon. By using a silicide as an electrode material, an electrode resistance is lowered, and therefore, silicides contribute greatly to enhance a switching speed of a logic device which requires a high speed.

FIGS. 1 through 4 are sectional views illustrating a method for fabricating a MOS transistor using a conventional selective silicide process.

Referring to FIG. 1, a gate insulating layer 110 and a gate polysilicon layer 120 are sequentially formed on a silicon substrate 100. After forming the gate polysilicon layer 120, impurity ions are firstly lightly implanted, using the gate polysilicon layer 120 as an ion implantation mask. Following this, a gate spacer 130 is formed on the sidewall of the gate polysilicon layer 120. Then, after impurity ions are secondly deeply implanted, using the gate polysilicon layer 120 and the gate spacer 130 as an ion implantation mask, the implanted impurity ions are diffused to form source/drain regions 140 of a lightly doped drain (LDD) structure. Then, a metal layer 150 is formed on the entire surface of the resultant structure having source/drain regions 140.

Referring to FIG. 2, a predetermined annealing process is performed on the resulting structure having the metal layer 150 to make the metal layer 150 react with silicon atoms of the gate polysilicon layer 120 and the source/drain region 140. After the annealing is completed, a first silicide layer 161 is formed on the gate polysilicon layer 120, and a second silicide layer 162 is formed on the source/drain region 140. The metal layer 150 which is not in contact with the gate polysilicon layer 120 and the source/drain region 140 does not react with the silicon atoms. Accordingly, after the first and second silicide layers 161 and 162 are formed, the portions of the metal layer which did not react are removed.

Referring to FIG. 3, an interdielectric layer 170 is formed to cover the entire surface of the resultant structure having the first and second silicide layers 161 and 162. Then, the interdielectric layer is planarized by a planarizing process like chemical mechanical polishing (CMP).

Referring to FIG. 4, contact holes are respectively formed in the interdielectric layer 170 to expose a part of the first silicide layer 161 and a part of the second silicide layer 162, and gate electrodes 181 and source/drain electrodes 182 are formed using metals. The resistance of the gate electrodes 181 and the source/drain electrodes 182 is lessened due to the existence of the first and second silicide layers 161 and 162, and, as a result, the operation speed of a device is enhanced.

However, the above method has the following problems.

First, the step of annealing the metal layer 150 over the silicon substrate 100 in order to form the first and second silicide layers 161 and 162, is performed at a high temperature, so that defects such as dislocations and crystal destruction can be generated in the region of the interface between the silicon substrate 100 and the metal layer 150. Second, a leakage current can be generated by heat treatment at a high temperature to form the first and second silicide layers 161 and 162. Third, after forming the first and second silicide layers 161 and 162, the profile of the gate polysilicon layer 120 can be changed by a chemical solution used for removing the metal layer 150 which does not react with the silicon atoms. Fourth, after forming the first and second suicide layers 161 and 162, the interdielectric layer 170 must be formed, to a thickness sufficient to protect the first silicide layer 161 in the following process.

In particular, for the MOS transistor, used in logic circuits which do not require high speed, forming the silicide layer over the source/drain region 140 does not have a great influence on the characteristics of the device operation speed. Accordingly, the silicide layer must be formed selectively in order not to affect the silicon substrate 100.

SUMMARY OF THE INVENTION

It is a feature of an embodiment of the present invention to provide a method for fabricating a MOS transistor using a selective silicide process so as not to produce defects in a silicon substrate.

In a preferred embodiment of the present invention, there is provided a method for fabricating a MOS transistor using a selective silicide process, including the following steps. A gate insulating layer and a gate polysilicon layer are sequentially formed on a substrate. Gate spacers are formed on the sidewalls of the gate insulating layer and the gate polysilicon layer. Impurity ions are implanted and diffused, using the gate spacers and the gate polysilicon layers as implant mask layers, to form a source/drain region in the silicon substrate. An etching blocking layer is formed to cover the source/drain region, the gate spacer and the gate polysilicon layer. A dielectric layer to cover the etching blocking layer is formed. The dielectric layer is planarized, and the etching blocking layer on the gate polysilicon layer is exposed. A part of the exposed etching blocking layer and a part of the gate spacer are etched, and a top surface and a top side of the gate polysilicon layer become exposed. A silicide layer is formed over the exposed part of the gate polysilicon layer.

Preferably, the etching blocking layer is formed of a material having an etching selectivity of one or more with the dielectric layer. Also, preferably, the etching blocking layer is formed to a thickness of 10–2000 angstroms.

The step of planarizing the dielectric layer can be performed using chemical mechanical polishing or etch back.

Preferably, the step of etching the exposed etching blocking layer and a part of the gate spacer is performed until the top side of the gate polysilicon layer becomes exposed by a thickness of 1500 angstroms or less.

After the step of etching the etching blocking layer and a part of the gate spacer, the step of removing a projecting part of the dielectric layer projecting toward the top portion of the gate polysilicon layer can be further included. In this case, it is preferable that the projecting part of the dielectric layer is removed by a wet etching method.

The step of forming the silicide layer, preferably, includes, a step of forming a metal layer on the exposed part of the dielectric layer, the etching blocking layer and the gate polysilicon layer, a step of heat-treating the resultant structure having the metal layer and forming a silicide layer between the gate polysilicon layer and the metal layer, and a step of removing the part of the metal layer which does not react during the heat treatment.

In the present invention, it is preferable to further include a step of forming an interdielectric layer over the resultant structure having the silicide layer, a step of patterning the interdielectric layer and forming contact holes which expose a part of the source/drain regions and a part of the suicide layer respectively, and a step of forming source/drain electrodes and gate electrodes respectively to contact the source/drain region and the silicide layer through the contact holes.

Also, it is preferable to further include a step of lightly implanting impurity ions, using the gate polysilicon layer as an ion injection mask after forming the gate polysilicon layer.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE INVENTION

Korean Patent Application No. 00-48326 filed Aug. 21, 2000, and entitled "Method For Fabricating MOS Transistor Using Selective Silicide Process," is incorporated herein by reference in its entirety.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

FIGS. 5 through 12 are sectional views illustrating a method for fabricating a MOS transistor using a selective silicide process according to the present invention.

Figure 1:
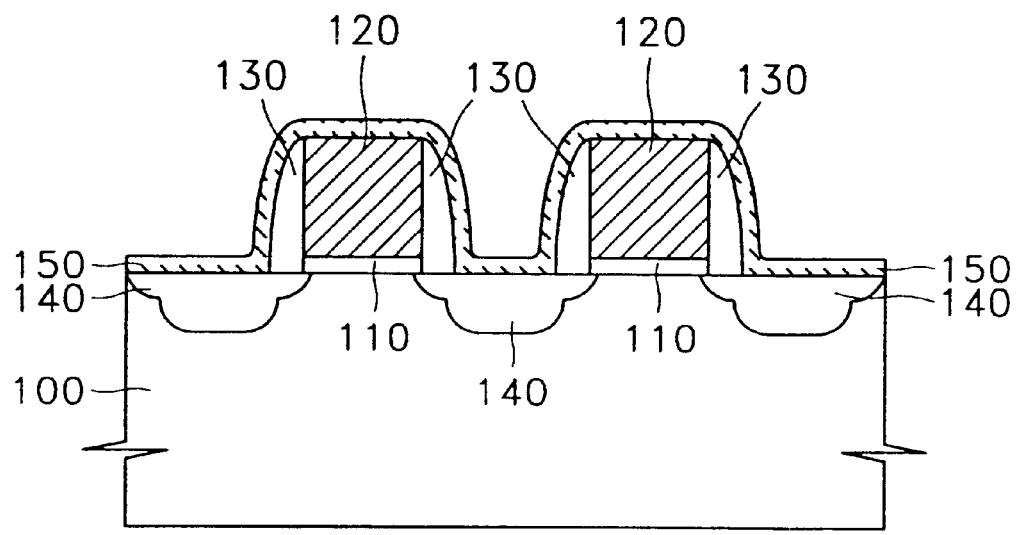
FIGS. 1 through 4 are sectional views illustrating a method for fabricating a MOS transistor using a conventional silicide process.
Figure 2:
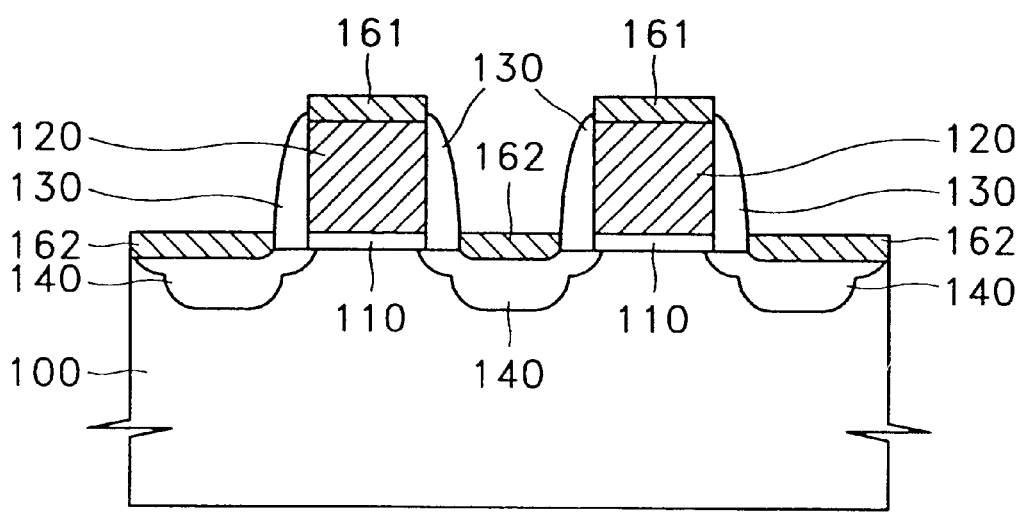
Figure 3:
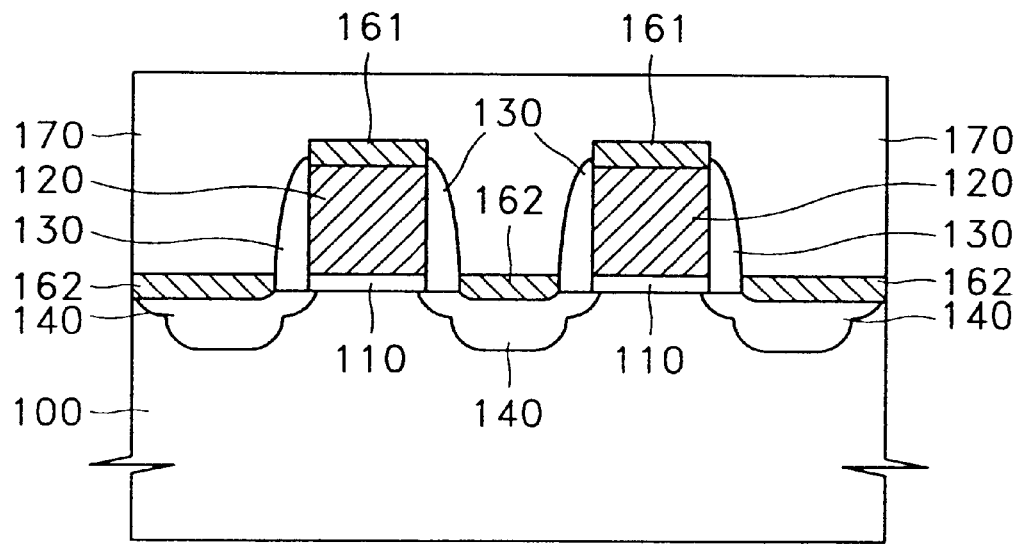
Figure 4:
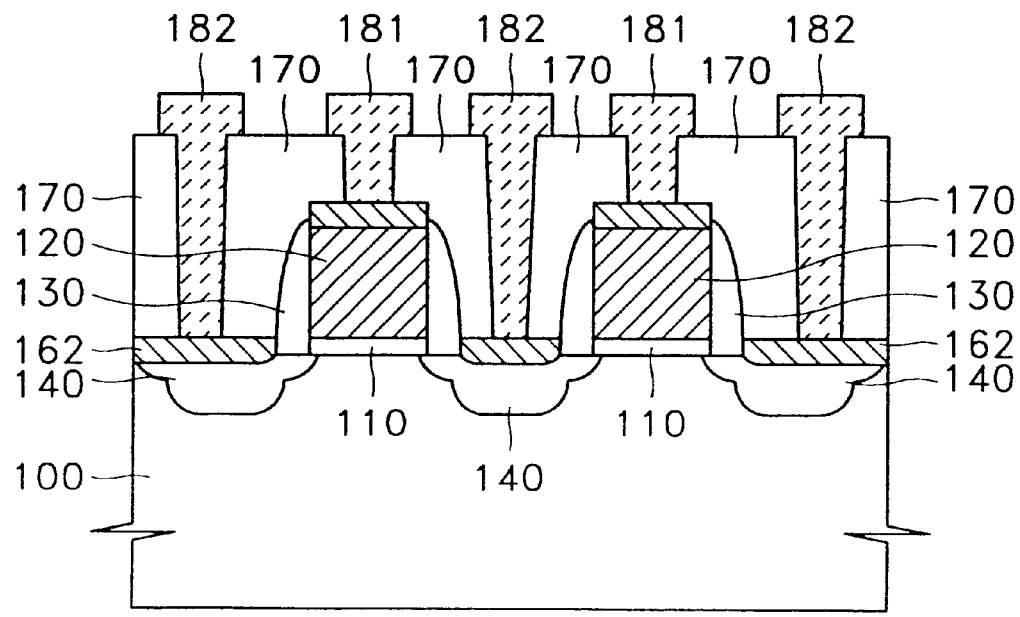
Figure 5:
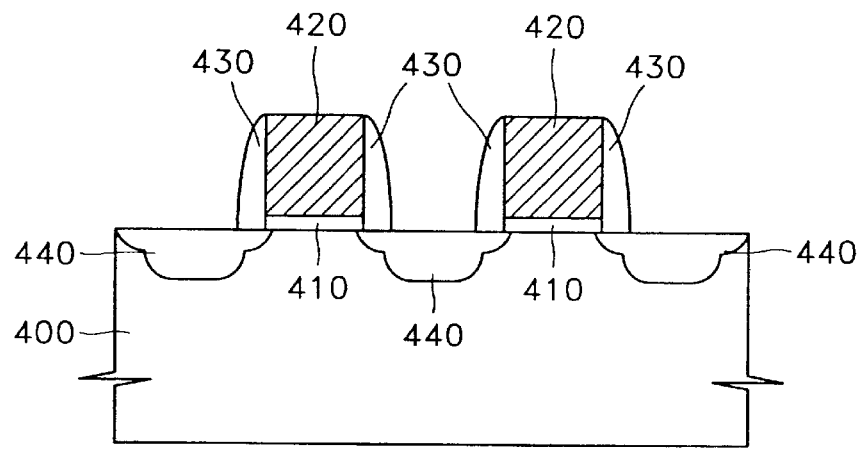
FIGS. 5 through 12 are sectional views illustrating a method for fabricating a MOS transistor using a selective silicide process according to the present invention.

As shown in FIG. 5, a gate insulating layer 410 and a gate polysilicon layer 420 are sequentially formed over a substrate 400. The substrate material is selected from a group consisting of silicon, silicon on insulator (SOI), silicon carbide, silicon on silicon carbide, silicon carbide on silicon, silicon germanium, silicon germanium on silicon, and silicon germanium carbide on silicon. After forming the gate polysilicon layer 420, impurity ions are first lightly implanted, using the gate polysilicon layer 420 as an ion implantation mask. Following this, using a conventional method, a gate spacer 430 is formed along the side walls of the gate polysilicon layer 420. The gate spacer can be formed of an SiN layer. Next, after impurity ions are secondly deeply implanted, using the gate polysilicon layer 420 and the gate spacer 430 as an ion implantation mask, the implanted impurity ions are diffused to form a source/drain region 440 of a lightly doped drain (LDD) structure within the silicon substrate 400.

Figure 6:
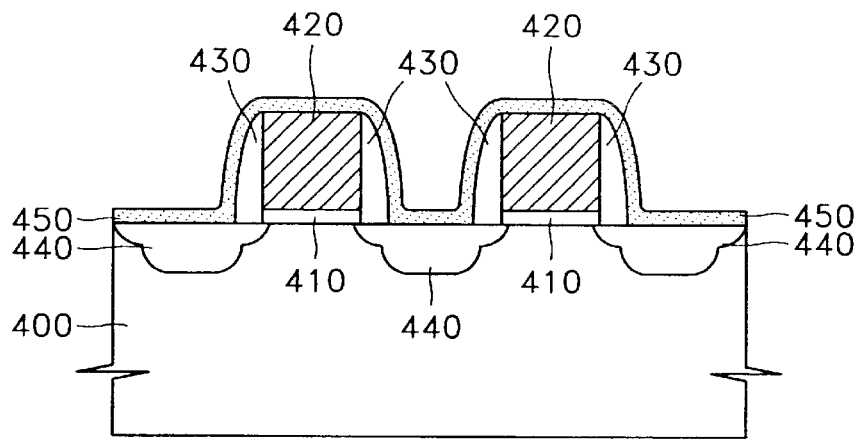

As shown in FIG. 6, an etching blocking layer 450 is formed to cover the source/drain region 440, the gate spacer 430 and the gate polysilicon layer 420. The etching blocking layer is formed of a material having an etching selectivity of at least 1 with a dielectric layer which will be formed in the following process. For example, if the dielectric layer is an oxide layer, the etching blocking layer 450 can be formed of an SiN layer or an SiON layer. The etching blocking layer 450 can be formed using a chemical vapor deposition method, and the thickness is about 10–2000 angstroms.

Figure 7:
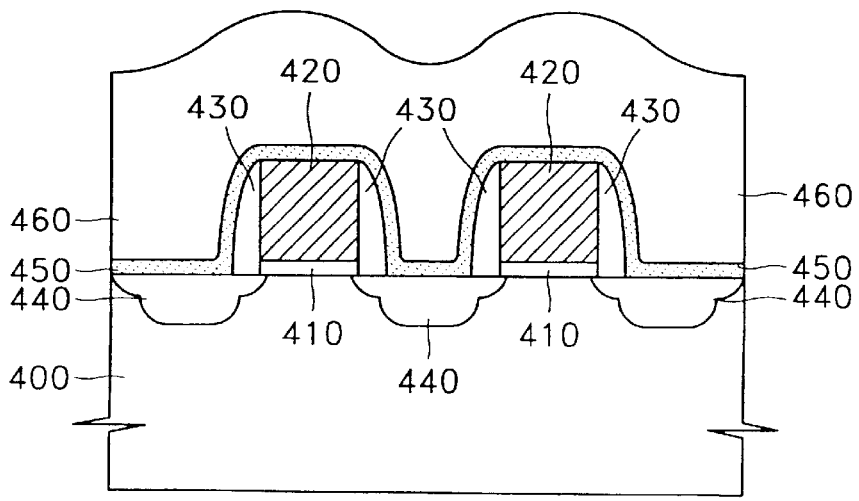

As shown in FIG. 7, a dielectric layer 460 is formed to cover the etching blocking layer 450. The dielectric layer 460 is formed using materials having good gap fill characteristics such that a step between a portion having the gate polysilicon layer 430 and a portion not having the gate polysilicon layer 430 is minimized, and thus an amount to be eliminated in a subsequent planarizing process is minimized. For example, a high density plasma (HDP) oxide, an undoped silicate glass (USG), boron phosphorous silicate glass (BPSG) or a tetra ethyl ortho silicate (TEOS) can be used, but it is not limited to these materials. Also, as illustrated previously, the etching selectivity of the dielectric layer 460 to the etching blocking layer 450 is equal to or more than 1.

Figure 8:
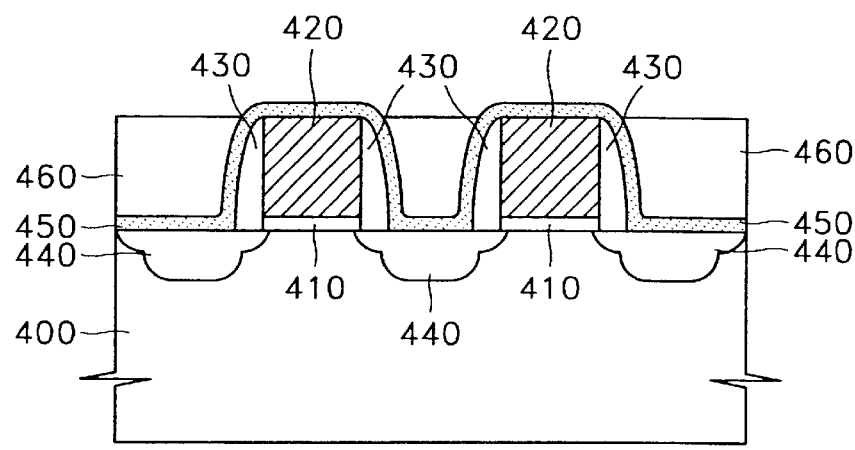

As shown in FIG. 8, the dielectric layer 460 is planarized, and the etching blocking layer 450 on the gate polysilicon layer 420 is exposed. The planarization is preformed by chemical mechanical polishing (CMP) or dry etch back. The etching selectivity of the dielectric layer 460 to the etching blocking layer 450 is equal to or greater than 1, so that the planarization can be performed until the etching blocking layer 450 is exposed, or until a specified time passes after the etching blocking layer 450 is exposed. According to circumstances, the planarization can be stopped before the etching blocking layer 450 is exposed. For example, the planarization may be stopped when the thickness of the dielectric layer 460 on the etching blocking layer 450 is equal to or less than about 2000 angstroms. In this case, in order to eliminate the dielectric layer 460 remaining on the etching blocking layer 450 over the gate polysilicon layer 420, a chemical solution having an etching selectivity of 1 or less, that is, a higher etching rate for the dielectric layer 460 than for the etching blocking layer 450 can be used to remove the remaining dielectric layer 460 for exposing the etching blocking layer 450 on the gate polysilicon layer 420. For example, if an oxide layer is used as the dielectric layer 460, and an SiN layer is used as the etching blocking layer 450, an LAL solution or an HF solution can be used as the chemical solution.

Figure 9:
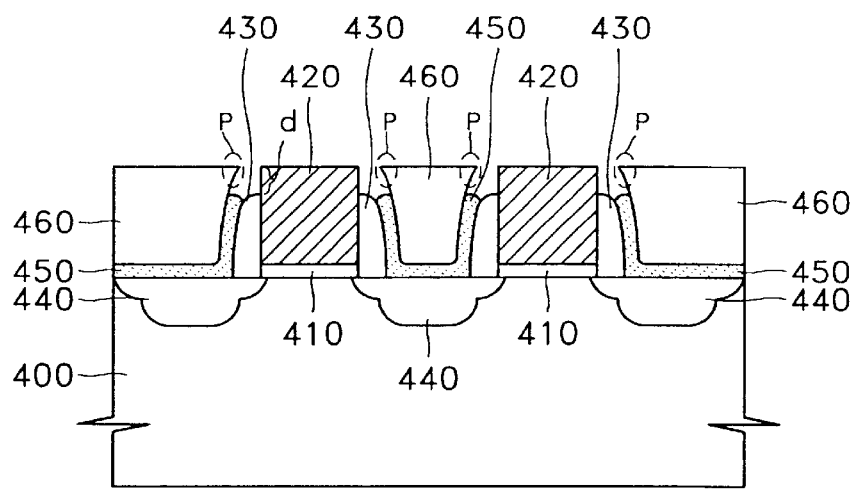

As shown in FIG. 9, the etching blocking layer 450 and a part of the gate spacer 430 are etched, and a top surface and a top side of the gate polysilicon layer 420 are exposed. The etching can be performed using both a wet etching method and a dry etching method. In any case, the etched amounts of the etching blocking layer 450 and the gate spacer 430 must be equal to or more than the etched amount of the dielectric layer 460. Also, in this case, the etching blocking layer 450 and the gate spacer 430 are over-etched to expose a section of the top sides of the gate polysilicon layer 420 of thickness equal to or less than 1500 angstroms. Generally, if the etching blocking layer 450 and the gate spacer 430 are formed of a nitride layer, the etching is performed using an $H_3PO_4$ solution. When the etching is performed on a part of the etching blocking layer 450 and a part of the gate spacer 430, grooves are formed around the top side of the gate polysilicon layer 420. Since the etching selectivity of the etching blocking layer 450 and the gate spacer 430 to the dielectric layer 460 is equal to or more than 1, the dielectric layer 460 becomes a shape having a projecting part (p)

toward the top of the gate polysilicon layer 420 after the etching is finished.

Figure 10:
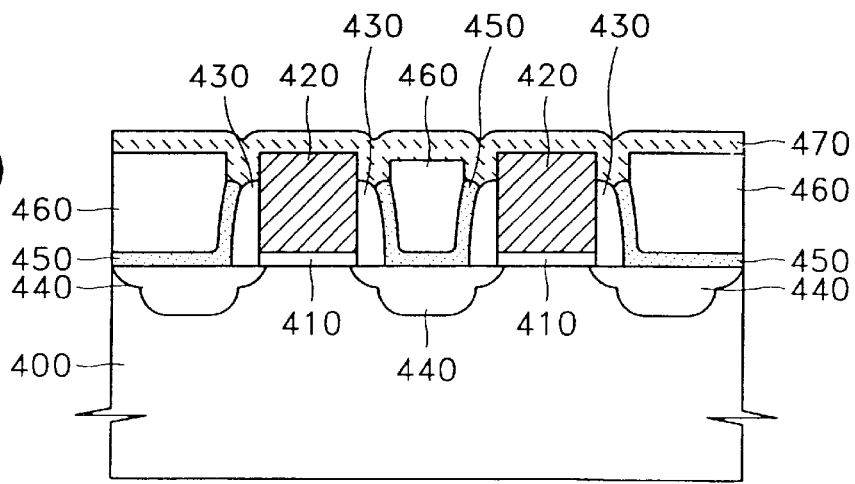

As shown in FIG. 10, the projecting part (p) of the dielectric layer 460 is removed. Then, a metal layer 470 is formed on the entire surface of the resulting structure. The projecting part (p) must be removed to obtain proper deposition profile during the deposition of a metal layer for forming a subsequent silicide layer, and it is removed by an ordinary isotropic etching method using an HF solution.

Figure 11:
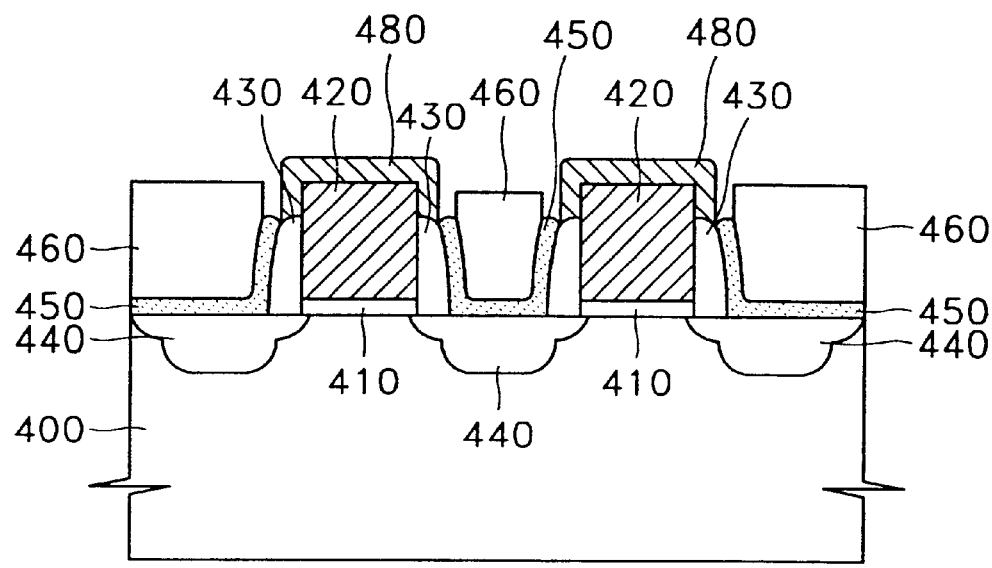

As shown in FIG. 11, a silicide layer 480 is formed over the exposed gate polysilicon layer 420. For doing this, annealing is performed on the resultant structure having the metal layer 470, and the metal layer 470 reacts with silicon atoms of the gate polysilicon layer 420. Due to this annealing step, a silicide layer 480 is formed at the interface between the gate polysilicon layer 420 and the metal layer 470. However, a part of the metal layer 470 which is not in contact with the gate polysilicon layer 420 does not react with the silicon atoms. Therefore, after forming the silicide layer 480, the part of the metal layer which did not react is removed using the conventional method.

Figure 12:
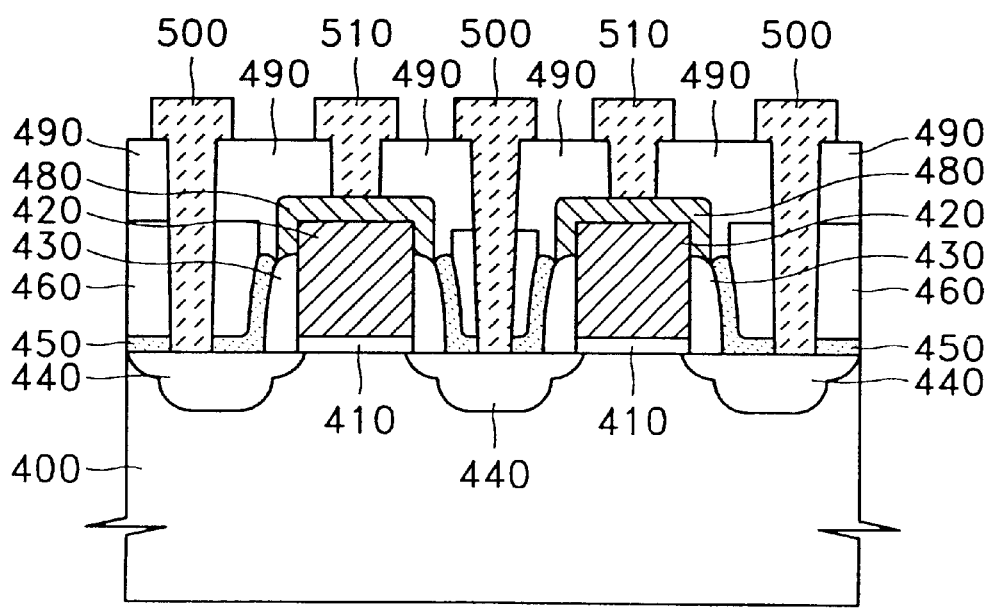

As shown in FIG. 12, an interdielectric layer 490 is formed to completely cover the resultant structure having the sulicide layer 480. Following this, an exposure and development using an ordinary lithography method are performed, and a photoresist layer pattern (not shown) is formed on the interdielectric layer 490. Then, the interdielectric layer 490 is etched using the photoresist pattern as an etching mask, and contact holes which expose a part of the sulicide layer 480 are formed. Simultaneously, the parts of the interdielectric layer 490, the dielectric layer 460, and the etching blocking layer 450 are etched to form contact holes which expose the source/drain region 440. Next, after removing 10o the photoresist layer pattern, the contact holes are filled with the metal layer to form source/drain electrodes 500 and gate electrodes 510.

As described above, in an MOS transistor which does not require high speed, the silicide layer is not formed on the source/drain region and is formed selectively on the gate polysilicon layer, so that the generation of defects within the silicon substrate during the silicide process can be avoided by the method for fabricating a MOS transistor using a selective silicide process according to the present invention. Also, since the silicide layer is formed after forming the dielectric layer, the thickness of the interdielectric layer which is formed to cover the silicide layer, after forming the sulicide layer, can be relatively thin.

What is claimed is:

1. A method for fabricating a MOS transistor comprising the steps of:
   sequentially forming a gate insulating layer and a gate polysilicon layer on a substrate;
   forming a gate spacer on a side wall of the gate insulating layer and the gate polysilicon layer;
   implanting and diffusing impurity ions into the substrate, using the gate spacer and the gate polysilicon layer as a mask layer, thereby forming a source/drain region on the substrate;
   forming an etching blocking layer to cover the source/drain region, the gate spacer, and the gate polysilicon layer;
   forming a dielectric layer to cover the etching blocking layer;
   planarizing the dielectric layer and exposing the etching blocking layer on the gate polysilicon layer;
   etching the exposed etching blocking layer and a part of the gate spacer, and exposing a top surface and a top side of the gate polysilicon layer; and
   selectively forming a silicide layer on the exposed gate polysilicon layer.

2. The method of claim 1, wherein the substrate is made from a material selected from the group consisting of silicon, silicon on insulator (SOI), silicon carbide, silicon on silicon carbide, silicon carbide on silicon, silicon germanium, silicon germanium on silicon, and silicon germanium carbide on silicon.

3. The method of claim 1, wherein the etching blocking layer is formed using materials having an etching selectivity of equal to or more than 1 with the dielectric layer.

4. The method of claim 3, wherein the etching blocking layer is silicon nitride or silicon oxynitride.

5. The method of claim 1, wherein the etching blocking layer is formed to have a thickness of 10–2000 angstroms.

6. The method of claim 1, wherein gaps are formed on the etching block layer, and the gaps on the etching block layer are filled without voids by the dielectric layer.

7. The method of claim 6, wherein the dielectric layer is made of a material selected from the group consisting of high density plasma (HDP) oxide, undoped silicate glass (USG), boro-phospho-silicate glass (BPSG) and tetra ethyl ortho silicate (TEOS) glass.

8. The method of claim 1, wherein the step of planarizing the dielectric layer is performed using a chemical mechanical polishing method.

9. The method of claim 1, wherein the step of planarizing the dielectric layer is performed using an etch back.

10. The method of claim 1, wherein the step of etching the exposed etching blocking layer and a part of the gate spacer is performed until the top side of the gate polysilicon layer is exposed by a thickness of equal to or less than 1500 angstroms.

11. The method of claim 1, further comprising a step of removing a projecting part of the dielectric layer projected toward the top portion of the gate polysilicon layer, after the step of etching the exposed etching blocking layer and a part of the gate spacer.

12. The method of claim 11, wherein the projecting part of the dielectric layer is removed, using a wet etching method.

13. The method of claim 1, wherein the step of forming the silicide layer comprises the steps of:
   forming a metal layer on the exposed surface of the dielectric layer, the etching blocking layer and the gate polysilicon layer;
   heat-treating the resultant structure having the metal layer and forming the silicide layer between the gate polysilicon layer and the metal layer; and
   removing a part of the metal layer which does not react during the heat-treating.

14. The method of claim 1, further comprising the steps of:
   forming an interdielectric layer over the resultant structure having the silicide layer;
   patterning the interdielectric layer and forming contact holes which expose a part of the surface of the source/drain region and the suicide layer; and
   forming source/drain electrodes and gate electrodes to be contacted to the source/drain region and the suicide layer, respectively, through the contact holes.

15. The method of claim 1, further comprising a step of lightly implanting impurity ions using the gate polysilicon layer as an ion implantation mask after forming the gate polysilicon layer.

* * * * *